United States Patent
Katsuki et al.

(10) Patent No.: US 7,605,523 B2
(45) Date of Patent: Oct. 20, 2009

(54) PIEZOELECTRIC DEVICE, ITS MANUFACTURING METHOD, AND TOUCH PANEL DEVICE

(75) Inventors: Takashi Katsuki, Kawasaki (JP); Fumihiko Nakazawa, Kawasaki (JP); Satoshi Sano, Kawasaki (JP); Yuji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/283,844

(22) Filed: Nov. 22, 2005

(65) Prior Publication Data

US 2006/0132000 A1    Jun. 22, 2006

Related U.S. Application Data

(63) Continuation of application No. PCT/JP03/06425, filed on May 22, 2003.

(51) Int. Cl.
*H01L 41/08* (2006.01)
*G09G 5/00* (2006.01)

(52) U.S. Cl. .................... 310/363; 345/173

(58) Field of Classification Search ........... 310/313 R, 310/313 D, 328, 311, 363; 345/177, 173, 345/174; *H01I 41/08; G09G 5/00*
See application file for complete search history.

(56) References Cited

U.S. PATENT DOCUMENTS

| | | | |
|---|---|---|---|
| 4,164,676 A | 8/1979 | Nishiyama et al. | |
| 5,124,272 A | 6/1992 | Saito et al. | |
| 5,717,434 A | 2/1998 | Toda | |
| 6,756,973 B2 * | 6/2004 | Sano et al. | 345/177 |
| 7,176,903 B2 * | 2/2007 | Katsuki et al. | 345/173 |

FOREIGN PATENT DOCUMENTS

| | | |
|---|---|---|
| JP | 58-30749 | 7/1983 |
| JP | 60-149214 | 8/1985 |
| JP | 63-21298 | 1/1988 |
| JP | 1-233815 | 9/1989 |
| JP | 3-224241 | 10/1991 |
| JP | 5-206776 | 8/1993 |
| JP | 6-6173 | 1/1994 |
| JP | 6-149459 | 5/1994 |
| JP | 06-177347 | 6/1994 |
| JP | 10-22764 | 1/1998 |
| JP | 10-055240 | * 2/1998 |
| JP | 10-55240 | 2/1998 |

OTHER PUBLICATIONS

Sano ( Development of Saw touch screen Institute of Electronics Information Report Nov. 22, 2002 vol. 102 p. 19-24).*
Fumihiko Nakazawa, et al., "Development of SAW Touch Panel", Technical Report of Institute of Electronics, Information and Communication Engineers, Nov. 2002, vol. 102, No. 486, pp. 19-24.

* cited by examiner

*Primary Examiner*—Walter Benson
*Assistant Examiner*—Karen B Addison
(74) *Attorney, Agent, or Firm*—Staas & Halsey LLP

(57) ABSTRACT

A piezoelectric device (X) includes a substrate (11) a piezoelectric film (12), a first electrode (13), and a second electrode (14). At least one of the first electrode (13) and the second electrode (14) is interposed between the substrate (11) and the piezoelectric film (12), and made of an Al alloy containing 0.1 to 3 wt % of at least one metal selected from the group consisting of Ti, Cr, Ni, Cu, Zn, Pd, Ag, Hf, W, Pt and Au.

10 Claims, 10 Drawing Sheets

PIEZOELECTRIC DEVICE, ITS MANUFACTURING METHOD, AND TOUCH PANEL DEVICE

This application is a continuing application, filed under 35 U.S.C. § 111(a), of International Application PCT/JP2003/006425, filed May 22, 2003.

TECHNICAL FIELD

The present invention relates to a piezoelectric device able to excite surface acoustic waves, and a manufacturing method thereof, and also a touch panel device having such piezoelectric devices as exciting means and receiving means.

BACKGROUND ART

Touch panel devices are sometimes used as means for inputting into computer systems in FA equipment, OA equipment, measuring equipment and so on. Touch panel devices are generally provided on the display of the equipment, and are for detecting the position where a finger or the like has contacted the surface of the display. Prescribed processing is carried out in the computer system of the equipment based on data relating to images displayed on the display and data relating to the position of contact detected by the touch panel device.

In the technical field of touch panel devices, in recent years SAW type touch panel devices that detect the position of contact using surface acoustic waves (SAWs) have garnered attention. A SAW type touch panel device comprises, for example, a transparent substrate having thereon a detection region and a peripheral region surrounding the detection region, and a plurality of exciting means and a plurality of receiving means provided in the peripheral region on the substrate. Each of the exciting means and the receiving means comprises a piezoelectric device. Such SAW type touch panel devices are described, for example, in Japanese Patent Application Laid-open No. 6-149459 and Japanese Patent Application Laid-open No. 10-55240.

The piezoelectric device constituting each exciting means or receiving means comprises, for example, an interdigital transducer (IDT) formed by patterning in the peripheral region on the substrate for each device, and a piezoelectric film provided in the peripheral region so as to cover the IDT. The IDT comprises a pair of comb tooth electrodes, with each of the comb tooth electrodes having a plurality of mutually parallel electrode fingers. The electrode fingers of one comb tooth electrode and the electrode fingers of the other comb tooth electrode are arranged alternately and parallel to each another. The piezoelectric film is made of a piezoelectric material that exhibits a property of an electric field being produced upon strain being applied thereto (a piezoelectric effect), and a property of strain being produced upon an electric field being applied thereto (an inverse piezoelectric effect).

When an AC voltage is applied to the IDT of a piezoelectric device acting as exciting means, an AC electric field is produced between adjacent electrode fingers. As a result, strain is produced in the piezoelectric film between the electrode fingers through an inverse piezoelectric effect, and hence prescribed acoustic waves are excited in the piezoelectric film by the IDT as a whole. At this time, acoustic waves of a wavelength equal to the pitch of the electrode fingers are excited most strongly. The excited acoustic waves propagate through the surface of the substrate, reaching a piezoelectric device acting as receiving means. In this device, an AC electric field is produced between the electrode fingers of the IDT through a piezoelectric effect in the piezoelectric film. Induced thereby, an alternating current is outputted from the IDT of the device.

During operation of the SAW type touch panel device, surface acoustic waves are produced from each of the piezoelectric devices acting as exciting means, and these surface acoustic waves propagate through the detection region of the substrate, and are received by particular piezoelectric devices acting as receiving means. In the case that a finger or the like is in contact with the touch panel device in the detection region, the amplitude of surface acoustic waves passing through the position of contact will be attenuated. The position of contact in the detection region can be identified/detected by detecting and analyzing this attenuation.

With such a SAW type touch panel device, for the exciting piezoelectric devices, the higher the electromechanical conversion efficiency thereof, the more efficiently acoustic waves are excited for a given applied voltage. On the other hand, for the receiving piezoelectric devices, the higher the electromechanical conversion efficiency thereof, the more efficiently an alternating current is outputted based on the received acoustic waves. Consequently, with a SAW type touch panel device, the higher the electromechanical conversion efficiency of each of the piezoelectric devices, the smaller the insertion loss (dB) in the transmission and reception of a signal between a pair of piezoelectric devices, whereby the driving voltage of the touch panel device can be reduced, or the detection precision of the touch panel device can be increased.

However, with a conventional SAW type touch panel device, a sufficiently high electromechanical conversion efficiency is not obtained in the piezoelectric devices, and hence it may be that the driving voltage can not be sufficiently reduced, or the required detection precision cannot be obtained.

DISCLOSURE OF THE INVENTION

The present invention was devised based on the above state of affairs; it is an object of the present invention to provide a piezoelectric device having a high electromechanical conversion efficiency, and a manufacturing method thereof, and also a SAW type touch panel device having such piezoelectric devices as exciting means and receiving means.

In a first aspect of the present invention, there is provided a piezoelectric device. This piezoelectric device comprises a substrate, a piezoelectric film, a first electrode, and a second electrode. At least one of the first electrode and the second electrode is interposed between the substrate and the piezoelectric film, and made of an Al alloy containing 0.1 to 3 wt % of at least one metal selected from the group consisting of Ti, Cr, Ni, Cu, Zn, Pd, Ag, Hf, W, Pt and Au. In the case that the Al alloy contains a plurality of metals selected from the above group, the content of each added metal in the Al alloy is in a range of 0.1 to 3 wt %.

From hitherto, the piezoelectric film in prescribed piezoelectric devices has been formed by depositing a piezoelectric material by sputtering, with the substrate being heated during the deposition. When the substrate is heated, each electrode already formed on the substrate (e.g. the IDT of a conventional piezoelectric device as described above) is heated together with the substrate, and hence due to a difference in the thermal expansion coefficient between the substrate and the electrode, hillocks (parts where the electrode peels away from the surface of the substrate) arise on the electrode. It is known that the more numerous such hillocks or the larger such hillocks, the lower the electromechanical conversion efficiency in the piezoelectric device. With a conventional piezoelectric device in a SAW type touch panel device, Al is often used as the material for constituting the IDT (electrodes). This is because Al has low electrical resistance, is cheap, and is easily processed. However, production/growth of hillocks is particularly prone to occur with such an Al electrode.

In the manufacture of the piezoelectric device according to the first aspect of the present invention, the first electrode and the second electrode are formed on the substrate in a prescribed pattern, and then the piezoelectric film is formed on the substrate so as to cover these electrodes. Alternatively, the first electrode is formed on the substrate in a prescribed pattern, then the piezoelectric film is formed on the substrate so as to cover the first electrode, and then the second electrode is further formed on the piezoelectric film. Alternatively, the second electrode is formed on the substrate in a prescribed pattern, then the piezoelectric film is formed on the substrate so as to cover the second electrode, and then the first electrode is further formed on the piezoelectric film. In each of these methods, when forming the piezoelectric film, the substrate is heated as in a conventional method, and hence the at least one electrode already formed on the substrate is also heated.

However, with the piezoelectric device according to the first aspect of the present invention, a higher electromechanical conversion efficiency than with a conventional piezoelectric device is obtained. This is because the at least one electrode interposed between the substrate and the piezoelectric film (the at least one of the first electrode and the second electrode) made of an Al alloy containing 0.1 to 3 wt % of at least one metal selected from the group consisting of Ti, Cr, Ni, Cu, Zn, Pd, Ag, Hf, W, Pt and Au, and hence is less prone to thermal expansion than an electrode comprising pure Al. It is thought that in the case that the at least one electrode that is already formed on the substrate when the piezoelectric film is formed and will be interposed between the substrate and the piezoelectric film in the manufactured piezoelectric device, is made of an Al alloy as described above, hillocks do not arise on this electrode when the piezoelectric film is formed, or else if hillocks do arise then the number and size thereof are kept down, and as a result a high electromechanical conversion efficiency can be obtained for the piezoelectric device.

In the case of the first aspect of the present invention, in a preferable embodiment, the first electrode is interposed between the substrate and the piezoelectric film, and the second electrode is provided on the piezoelectric film. With this constitution, the first and second electrodes, which sandwich the piezoelectric film, are used for applying a voltage to the piezoelectric film. In this case, preferably, the second electrode has a base portion, and a plurality of branch electrodes that extend out from the base portion and are parallel to one another, and the first electrode has a part that faces all of the branch electrodes with the piezoelectric film therebetween. In this case, $h/\lambda$ preferably has a value in a range of 0.005 to 0.1, where h is the thickness of the piezoelectric film, and $\lambda$ is the electrode period of the plurality of branch electrodes. Such a range for $h/\lambda$ is suitable in terms of obtaining a high electromechanical conversion efficiency.

In the case of the first aspect of the present invention, in another preferable embodiment, the first electrode and the second electrode are interposed between the substrate and the piezoelectric film, and form an interdigital transducer (IDT). With this constitution, the IDT interposed between the substrate and the piezoelectric film is used for applying a voltage to the piezoelectric film.

In a second aspect of the present invention, there is provided a method of manufacturing a piezoelectric device. This manufacturing method comprises a step of forming a first electrode comprising an Al alloy containing 0.1 to 3 wt % of at least one metal selected from the group consisting of Ti, Cr, Ni, Cu, Zn, Pd, Ag, Hf, W, Pt and Au on a substrate, a step of removing an oxide film on a surface of the first electrode, a step of forming a piezoelectric film overlapping the first electrode on the substrate, and a step of forming a second electrode on the piezoelectric film.

Through this method, a piezoelectric device according to the first aspect of the present invention can be suitably manufactured. According to the second aspect of the present invention, a high electromechanical conversion efficiency can thus be obtained for the piezoelectric device manufactured.

In a third aspect of the present invention, there is provided another method of manufacturing a piezoelectric device. This manufacturing method comprises a step of forming a first electrode comprising an Al alloy containing 0.1 to 3 wt % of at least one metal selected from the group consisting of Ti, Cr, Ni, Cu, Zn, Pd, Ag, Hf, W, Pt and Au on a substrate, a step of subjecting a surface of the first electrode to etching treatment, a step of forming a piezoelectric film overlapping the first electrode on the substrate, and a step of forming a second electrode on the piezoelectric film.

Through this method, a piezoelectric device according to the first aspect of the present invention can be suitably manufactured. According to the third aspect of the present invention, a high electromechanical conversion efficiency can thus be obtained for the piezoelectric device manufactured.

In the case of the third aspect of the present invention, preferably, the second electrode has a base portion, and a plurality of branch electrodes that extend out from the base portion and are parallel to one another, and the first electrode has a part that faces all of the branch electrodes with the piezoelectric film therebetween.

In a fourth aspect of the present invention, there is provided another method of manufacturing a piezoelectric device. This manufacturing method comprises a step of forming an IDT comprising an Al alloy containing 0.1 to 3 wt % of at least one metal selected from the group consisting of Ti, Cr, Ni, Cu, Zn, Pd, Ag, Hf, W, Pt and Au on a substrate, a step of removing an oxide film on a surface of the IDT, and a step of forming a piezoelectric film overlapping the IDT on the substrate.

Through this method, a piezoelectric device according to the first aspect of the present invention can be suitably manufactured. According to the fourth aspect of the present invention, a high electromechanical conversion efficiency can thus again be obtained for the piezoelectric device manufactured.

In a fifth aspect of the present invention, there is provided another method of manufacturing a piezoelectric device. This manufacturing method comprises a step of forming an IDT comprising an Al alloy containing 0.1 to 3 wt % of at least one metal selected from the group consisting of Ti, Cr, Ni, Cu, Zn, Pd, Ag, Hf, W, Pt and Au on a substrate, a step of subjecting a surface of the IDT to etching treatment, and a step of forming a piezoelectric film overlapping the IDT on the substrate.

Through this method, a piezoelectric device according to the first aspect of the present invention can be suitably manufactured. According to the fifth aspect of the present invention, a high electromechanical conversion efficiency can thus again be obtained for the piezoelectric device manufactured.

In a sixth aspect of the present invention, there is provided a touch panel device. This touch panel device comprises a substrate including thereon a detection region and a peripheral region surrounding the detection region, exciting means provided in the peripheral region, for exciting surface acoustic waves in the substrate, and receiving means provided in the peripheral region, for receiving surface acoustic waves propagated through the detection region. At least one of the exciting means and the receiving means comprises a piezoelectric film, a first electrode, and a second electrode. At least one of the first electrode and the second electrode is interposed between the substrate and the piezoelectric film, and made of an Al alloy containing 0.1 to 3 wt % of at least one metal selected from the group consisting of Ti, Cr, Ni, Cu, Zn, Pd, Ag, Hf, W, Pt and Au.

At least one of the exciting means and the receiving means of the touch panel device having this constitution is constituted from a piezoelectric device having a high electromechanical conversion efficiency according to the first aspect of the present invention. The touch panel device according to the sixth aspect of the present invention is thus suitable in terms of reducing the driving voltage or improving the detection precision.

In the case of the sixth aspect of the present invention, in a preferable embodiment, the first electrode is interposed between the substrate and the piezoelectric film, and the second electrode is provided on the piezoelectric film. In this case, preferably, the second electrode has a base portion, and a plurality of branch electrodes that extend out from the base portion and are parallel to one another, and the first electrode has a part that faces all of the branch electrodes with the piezoelectric film therebetween. In this case, h/λ preferably has a value in a range of 0.005 to 0.1, where h is the thickness of the piezoelectric film, and λ is the electrode period of the plurality of branch electrodes.

In the case of the sixth aspect of the present invention, in another preferable embodiment, the first electrode and the second electrode are interposed between the substrate and the piezoelectric film, and form an IDT.

In the case of any of the first to sixth aspects of the present invention, the piezoelectric film is preferably made of Mn-doped ZnO. A constituent material of the at least one electrode interposed between the substrate and the piezoelectric film may diffuse into the piezoelectric film under a high temperature, and such diffusion of an electrode-constituting material into the piezoelectric film will often cause the electromechanical conversion efficiency of the piezoelectric device to drop. If the piezoelectric material ZnO is doped with Mn, then diffusion of an electrode-constituting material, e.g. Al, into the piezoelectric film is suppressed. The present constitution is thus suitable in terms of obtaining a high electromechanical conversion efficiency for the piezoelectric device.

BEST MODE FOR CARRYING OUT THE INVENTION

Figure 1:
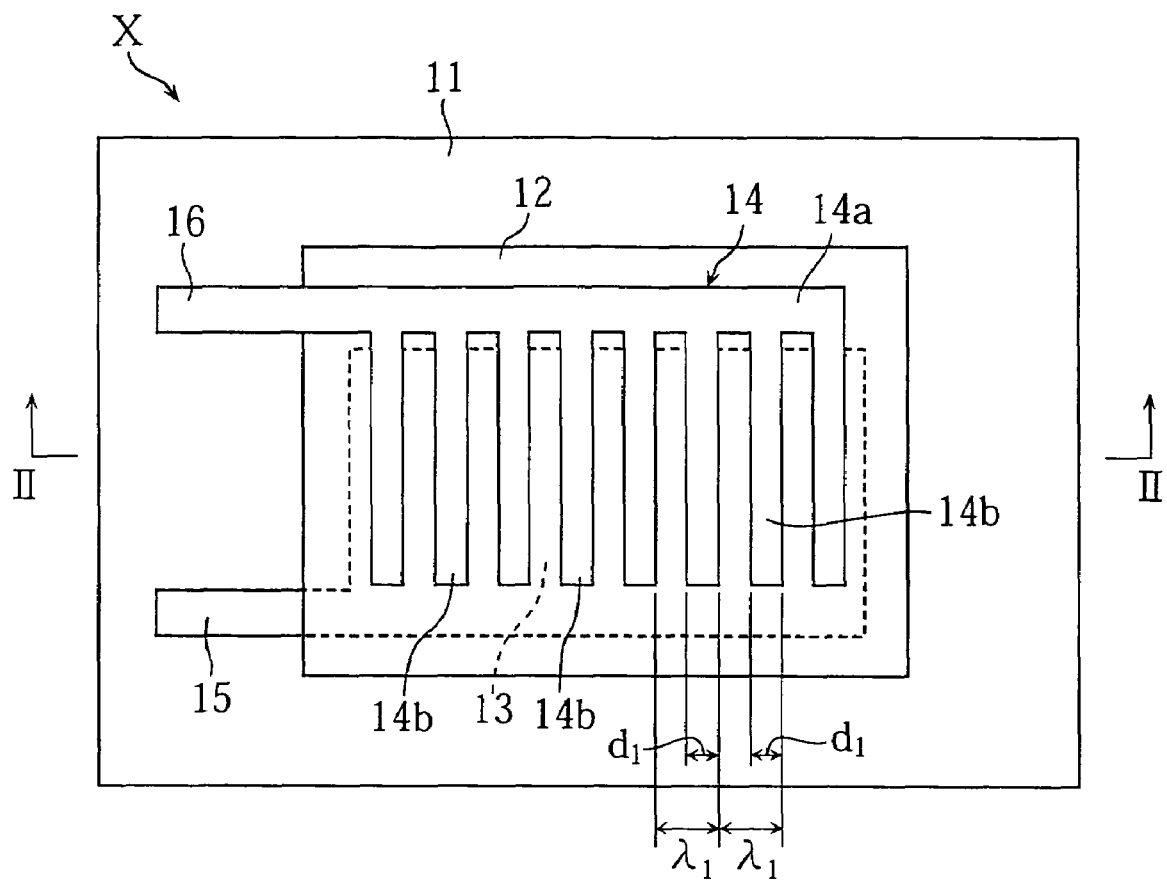
FIG. 1 is a plan view of a piezoelectric device according to a first embodiment of the present invention.
Figure 2:
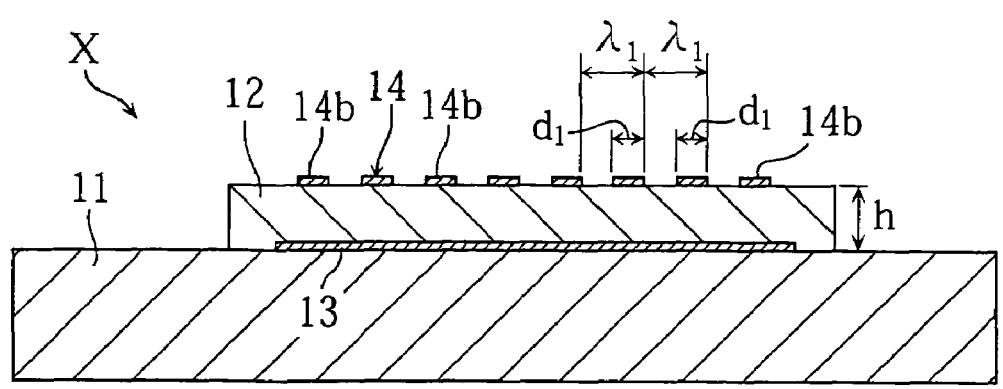
FIG. 2 is a sectional view along line II-II in FIG. 1.

FIGS. 1 and 2 show a piezoelectric device X according to a first embodiment of the present invention. The piezoelectric device X has a substrate 11, a piezoelectric film 12, and electrodes 13 and 14, and is constituted so as to be able to excite and receive surface acoustic waves.

The substrate 11 has a function of securing the rigidity of the device, and is also a medium through which surface acoustic waves will propagate. The substrate 11 is, for example, a non-piezoelectric substrate such as a transparent glass substrate.

The piezoelectric film 12 is made of a piezoelectric material that exhibits a property of an electric field being produced upon strain being applied thereto (a piezoelectric effect), and a property of strain being produced upon an electric field being applied thereto (an inverse piezoelectric effect). As such a piezoelectric material, for example Mn-doped ZnO, ZnO or AlN can be used. The thickness h of the piezoelectric film 12 is, for example, 1.0 to 3.0 μm.

The electrode 13 is interposed between the substrate 11 and the piezoelectric film 12, and made of an Al alloy containing 0.1 to 3 wt % of at least one metal selected from the group consisting of Ti, Cr, Ni, Cu, Zn, Pd, Ag, Hf, W, Pt and Au. In the case that the Al alloy contains a plurality of metals selected from the above group, the content of each added metal in the Al alloy is in a range of 0.1 to 3 wt %. Continuing on from the electrode 13 is a terminal 15 having a part that is exposed to the outside. The thickness of the electrode 13 is, for example, 300 to 600 nm.

The electrode 14 is provided on the piezoelectric film 12, and has a comb tooth structure comprising a base portion 14a and a plurality of branch electrodes 14b. The branch electrodes 14b extend out from the base portion 14a, and are parallel to one another. The mutually parallel branch electrodes 14b may be bent or curved instead of straight as shown in FIG. 1. Moreover, the branch electrodes 14b face the electrode 13 with the piezoelectric film 12 therebetween.

The thickness of the electrode 14 is, for example, 300 to 600 nm, the width $d_1$ of each of the branch electrodes 14b is, for example, 40 to 60 μm, and the electrode period $\lambda_1$ of the branch electrodes 14b is, for example, 100 to 150 μm. The thickness h of the piezoelectric film 12 and the electrode period $\lambda_1$ of the branch electrodes 14b preferably satisfy the relationship $0.005 \leq h/\lambda_1 \leq 0.1$.

The electrode 14 is made of a prescribed electrically conductive material. As the constituent material of the electrode 14, the same as for the electrode 13 may be used. Moreover, continuing on from the electrode 14 is a terminal 16.

Figure 3A:
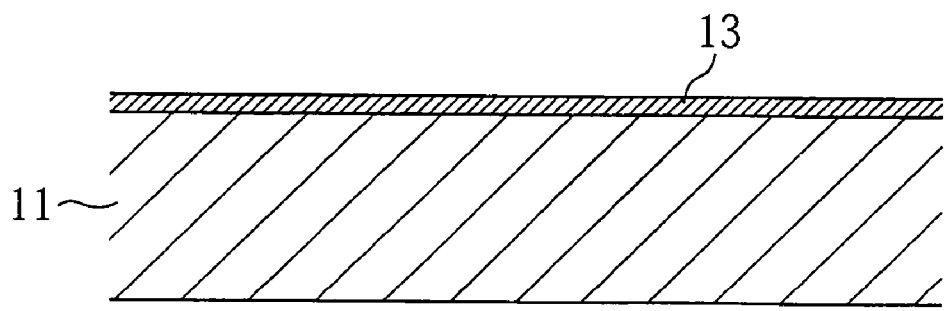
FIGS. 3A to 3C show a method of manufacturing the piezoelectric device shown in FIG. 1. Each drawing is a partial sectional view.
Figure 3B:
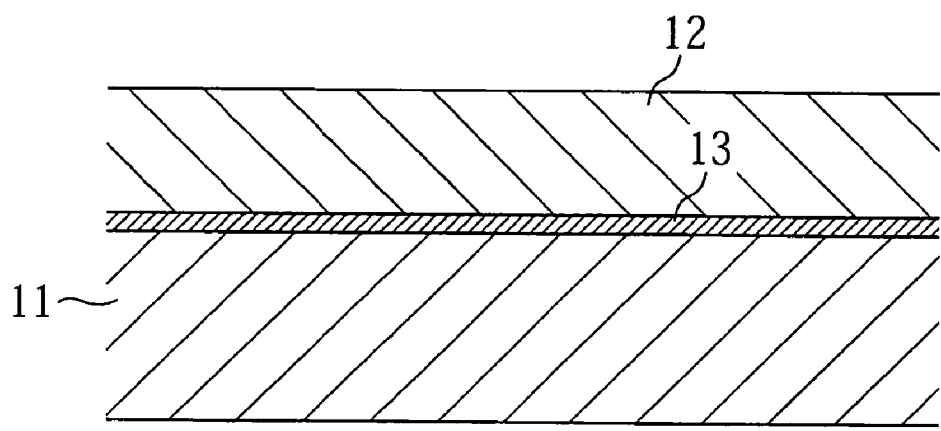
Figure 3C:
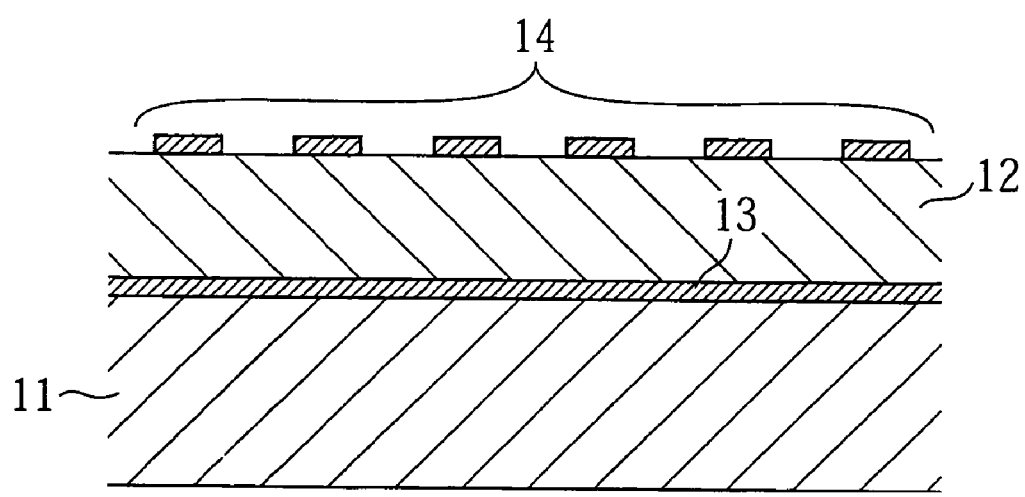

FIGS. 3A to 3C show a method of manufacturing the piezoelectric device X. In the manufacture of the piezoelectric device X, first, the electrode 13 is formed on the substrate 11 as shown in FIG. 3A, and together with this the terminal 15 (not shown in FIGS. 3A to 3C) is formed.

In the formation of these, first, an Al alloy film is formed on the substrate 11. The Al alloy contains 0.1 to 3 wt % of at least one metal selected from the group consisting of Ti, Cr, Ni, Cu, Zn, Pd, Ag, Hf, W, Pt and Au. As the film formation method, sputtering or vapor deposition can be used. In the formation of the electrode 13 and the terminal 15, next, a resist pattern is formed on the Al alloy film. This resist pattern is for masking places on the Al alloy film that are to be made into the electrode 13 and the terminal 15. Next, the Al alloy film is etched with the resist pattern as a mask. As a result, the electrode 13 and the terminal 15 can be formed on the substrate 11.

After the electrode 13 has been formed, the surface of the electrode 13 is preferably subjected to etching treatment. As the surface treatment method, for example reverse sputtering using an Ar plasma can be used. It is thought that through such surface treatment, an oxide film produced through natural oxidation of the surface of the electrode 13 after the formation of the electrode 13 is removed.

In the manufacture of the piezoelectric device X, next, the piezoelectric film 12 is formed on the substrate 11 as shown in FIG. 3B. Specifically, a piezoelectric material film is formed on the substrate 11 by sputtering, and then the piezoelectric material film is etched with a prescribed resist pattern as a mask, whereby a piezoelectric film 12 having a prescribed form in terms of the plan view is formed. When forming the piezoelectric material film by sputtering, the substrate 11 is heated to a prescribed temperature. As a result, the electrode 13 is heated together with the substrate 11, and hence hillocks do not arise on the electrode 13, or else if hillocks do arise then the number and size thereof are kept down. This is because an electrode 13 comprising an Al alloy containing 0.1 to 3 wt % of at least one metal selected from the group consisting of Ti, Cr, Ni, Cu, Zn, Pd, Ag, Hf, W, Pt and Au is not prone to thermal expansion.

Next, the electrode 14 is formed on the piezoelectric film 12 as shown in FIG. 3C, and together with this the terminal 16 (not shown in FIG. 3C) is formed. In the formation of these, first, a film of a prescribed electrically conductive material is formed over the surface of the substrate 11 and the surface of the piezoelectric film 12. As the film formation method, sputtering or vapor deposition can be used. Next, a resist pattern is formed on the electrically conductive film. This resist pattern is for masking places on the electrically conductive film that are to be made into the electrode 14 and the terminal 16. Next, the electrically conductive film is etched with the resist pattern as a mask. As a result, the electrode 14 and the terminal 16 can be formed.

In the formation of the electrode 14 and the terminal 16, a printing method may be used instead of the method using sputtering described above. In such a printing method, first, for example an Ag paste is printed or applied onto the surface of the substrate 11 and the surface of the piezoelectric film 12 via a prescribed mask. Next, the mask is removed, and then the Ag paste is sintered or annealed to evaporate off solvent in the paste. In this way, an electrode 14 and a terminal 16 comprising Ag can be formed.

Through the above, a piezoelectric device X having a high electromechanical conversion efficiency can be manufactured. In the piezoelectric film formation step described above with reference to FIG. 3B, a piezoelectric material film for forming the piezoelectric film 12 can be formed while suppressing production/growth of hillocks on the electrode 13 already formed on the substrate 11. It is thought that the reason that a high electromechanical conversion efficiency is obtained with the piezoelectric device X is that production/growth of hillocks on the electrode 13 during the formation of the piezoelectric film is suppressed. Moreover, in the case of subjecting the surface of the electrode 13 to etching treatment after forming the electrode 13, it is thought that this surface treatment contributes to suppressing the production/growth of hillocks during the formation of the piezoelectric film.

Figure 4:
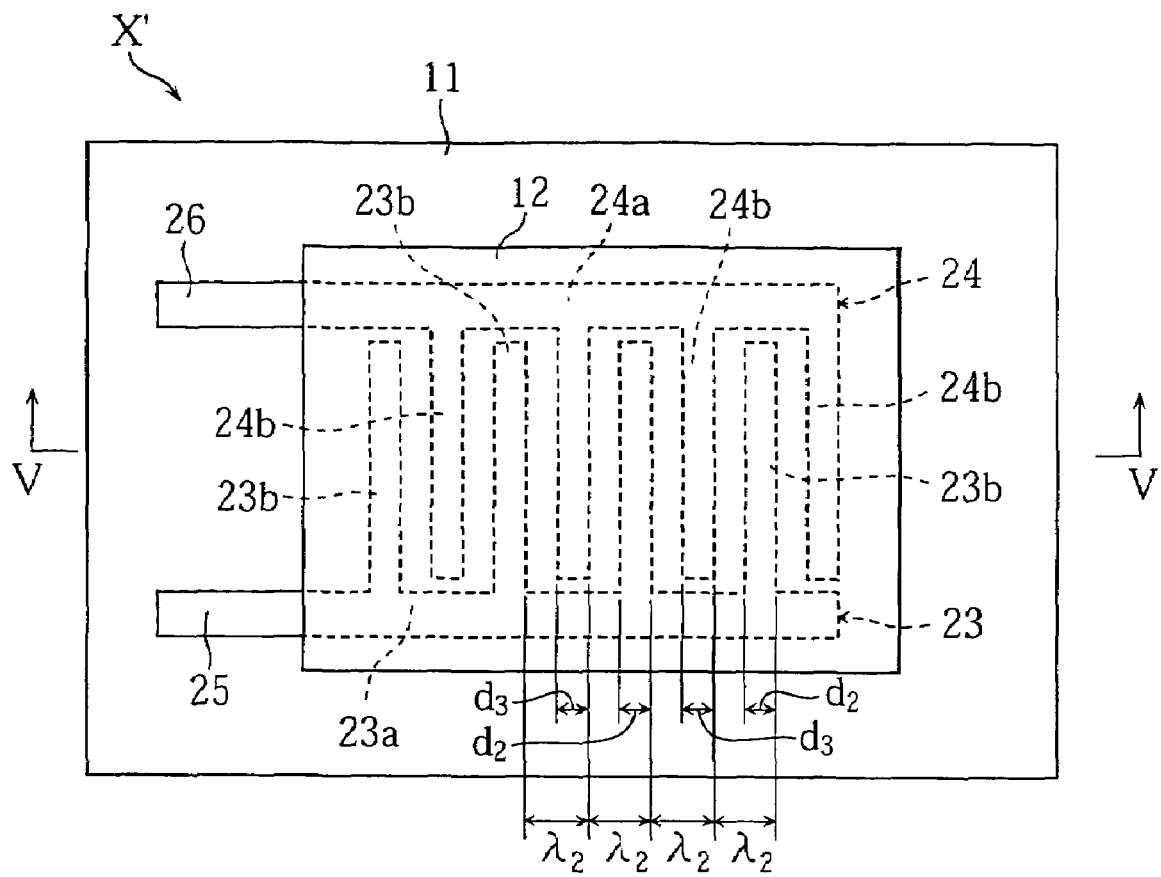
FIG. 4 is a plan view of a piezoelectric device according to a second embodiment of the present invention.
Figure 5:
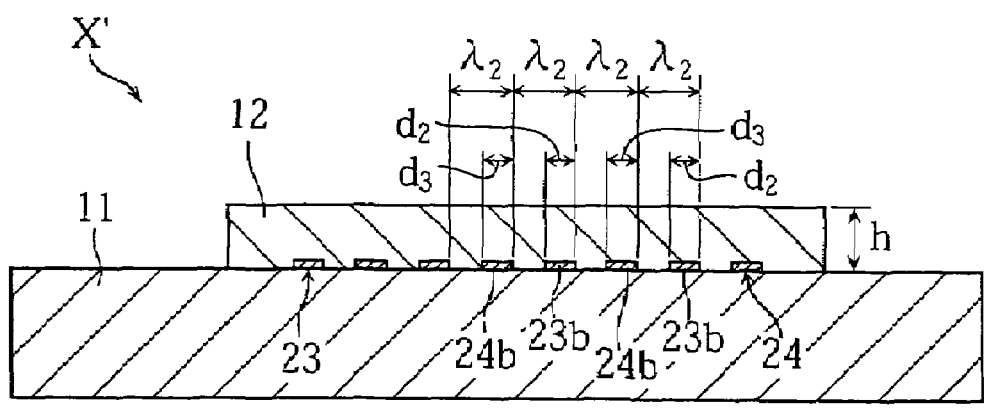
FIG. 5 is a sectional view along line V-V in FIG. 4.

FIGS. 4 and 5 show a piezoelectric device X' according to a second embodiment of the present invention. The piezoelectric device X' has a substrate 11, a piezoelectric film 12, and electrodes 23 and 24, and is constituted so as to be able to excite and receive surface acoustic waves. The piezoelectric device X' differs to the piezoelectric device X in having the electrodes 23 and 24 instead of the electrodes 13 and 14. The substrate 11 and the piezoelectric film 12 are as described above with regard to the first embodiment.

The electrodes 23 and 24 form an interdigital transducer interposed between the substrate 11 and the piezoelectric film 12, and each is made of an Al alloy containing 0.1 to 3 wt % of at least one metal selected from the group consisting of Ti, Cr, Ni, Cu, Zn, Pd, Ag, Hf, W, Pt and Au. In the case that the Al alloy contains a plurality of metals selected from the above group, the content of each added metal in the Al alloy is in a range of 0.1 to 3 wt %.

The electrode 23 has a comb tooth structure comprising a base portion 23a and a plurality of branch electrodes 23b. The branch electrodes 23b extend out from the base portion 23a, and are parallel to one another. Continuing on from the electrode 23 is a terminal 25 having a part that is exposed to the outside.

The electrode 24 has a comb tooth structure comprising a base portion 24a and a plurality of branch electrodes 24b. The branch electrodes 24b extend out from the base portion 24a, and are parallel to one another. Moreover, the branch electrodes 24b are also parallel to the branch electrodes 23b. Continuing on from the electrode 24 is a terminal 26 having a part that is exposed to the outside.

The thickness of each of the electrodes 23 and 24 is, for example, 300 to 600 nm, the width $d_2$ of each of the branch electrodes 23b and 24b is, for example, 20 to 30 μm, and the electrode period $\lambda_2$ of the branch electrodes 23b and 24b is, for example, 100 to 150 μm.

Figure 6A:
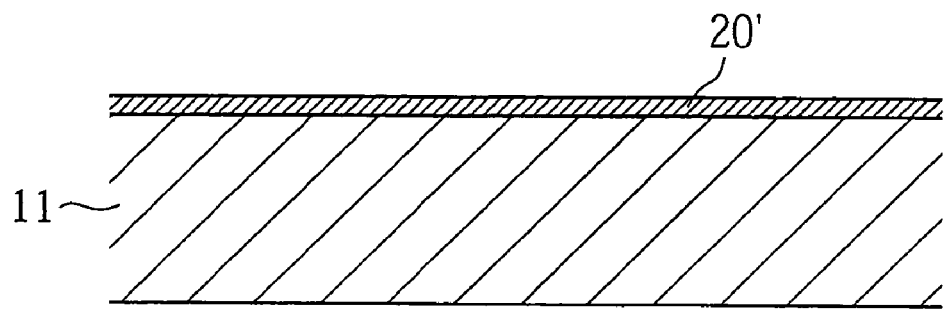
FIGS. 6A to 6C show a method of manufacturing the piezoelectric device shown in FIG. 4. Each drawing is a partial sectional view.
Figure 6B:
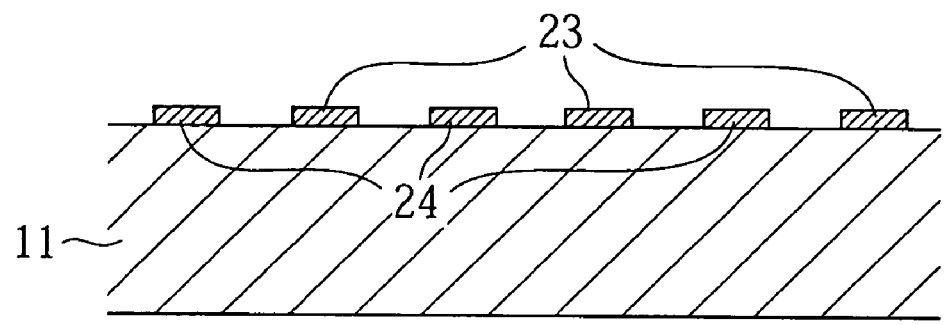
Figure 6C:
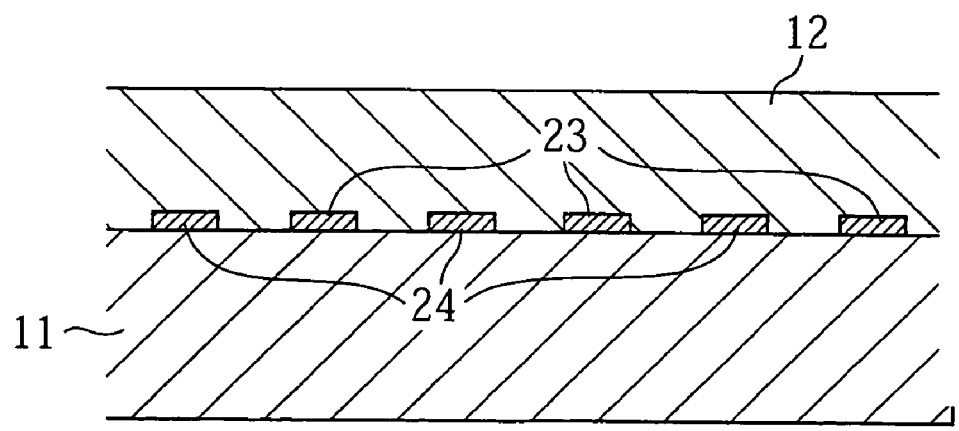

FIGS. 6A to 6C show a method of manufacturing the piezoelectric device X'. In the manufacture of the piezoelectric device X', first, an Al alloy film 20' is formed on the substrate 11 as shown in FIG. 6A. The Al alloy contains 0.1 to 3 wt % of at least one metal selected from the group consisting of Ti, Cr, Ni, Cu, Zn, Pd, Ag, Hf, W, Pt and Au. As the film formation method, sputtering or vapor deposition can be used.

Next, the Al alloy film 20' is patterned, thus forming the electrodes 23 and 24 on the substrate 11 as shown in FIG. 6B, and also forming the terminals 25 and 26 (not shown in FIGS. 6B and 6C). Specifically, first, a resist pattern is formed on the Al alloy film 20'. This resist pattern is for masking places on the Al alloy film 20' that are to be made into the electrodes 23 and 24 and the terminals 25 and 26. Next, the Al alloy film 20' is etched with the resist pattern as a mask. As a result, the electrodes 23 and 24 and the terminals 25 and 26 can be formed on the substrate 11.

After the electrodes 23 and 24 have been formed, the surface of the electrodes 23 and 24 is preferably subjected to etching treatment. As the surface treatment method, for example reverse sputtering using an Ar plasma can be used. It is thought that through such treatment, an oxide film produced through natural oxidation of the surface of the electrodes 23 and 24 after the formation of the electrodes 23 and 24 is removed.

In the manufacture of the piezoelectric device X', next, the piezoelectric film 12 is formed on the substrate 11 as shown in FIG. 6C. Specifically, a piezoelectric material film is formed on the substrate 11 by sputtering, and then the piezoelectric material film is etched with a prescribed resist pattern as a mask, whereby a piezoelectric film 12 having a prescribed form in terms of the plan view is formed. When forming the piezoelectric material film by sputtering, the substrate 11 is heated to a prescribed temperature. As a result, the electrodes 23 and 24 are heated together with the substrate 11, and hence hillocks do not arise on the electrodes 23 and 24, or else if hillocks do arise then the number and size thereof are kept down. This is because electrodes 23 and 24 comprising an Al alloy containing 0.1 to 3 wt % of at least one metal selected from the group consisting of Ti, Cr, Ni, Cu, Zn, Pd, Ag, Hf, W, Pt and Au are not prone to thermal expansion.

Through the above, a piezoelectric device X' having a high electromechanical conversion efficiency can be manufactured. In the piezoelectric film formation step described above with reference to FIG. 6C, a piezoelectric material film for forming the piezoelectric film 12 can be formed while suppressing production/growth of hillocks on the electrodes 23 and 24 already formed on the substrate 11. It is thought that the reason that a high electromechanical conversion efficiency is obtained with the piezoelectric device X' is that production/growth of hillocks on the electrodes 23 and 24 during the formation of the piezoelectric film is suppressed. Moreover, in the case of subjecting the surface of the electrodes 23 and 24 to etching treatment after forming the electrodes 23 and 24, it is thought that this surface treatment contributes to suppressing the production/growth of hillocks during the formation of the piezoelectric film.

Figure 7:
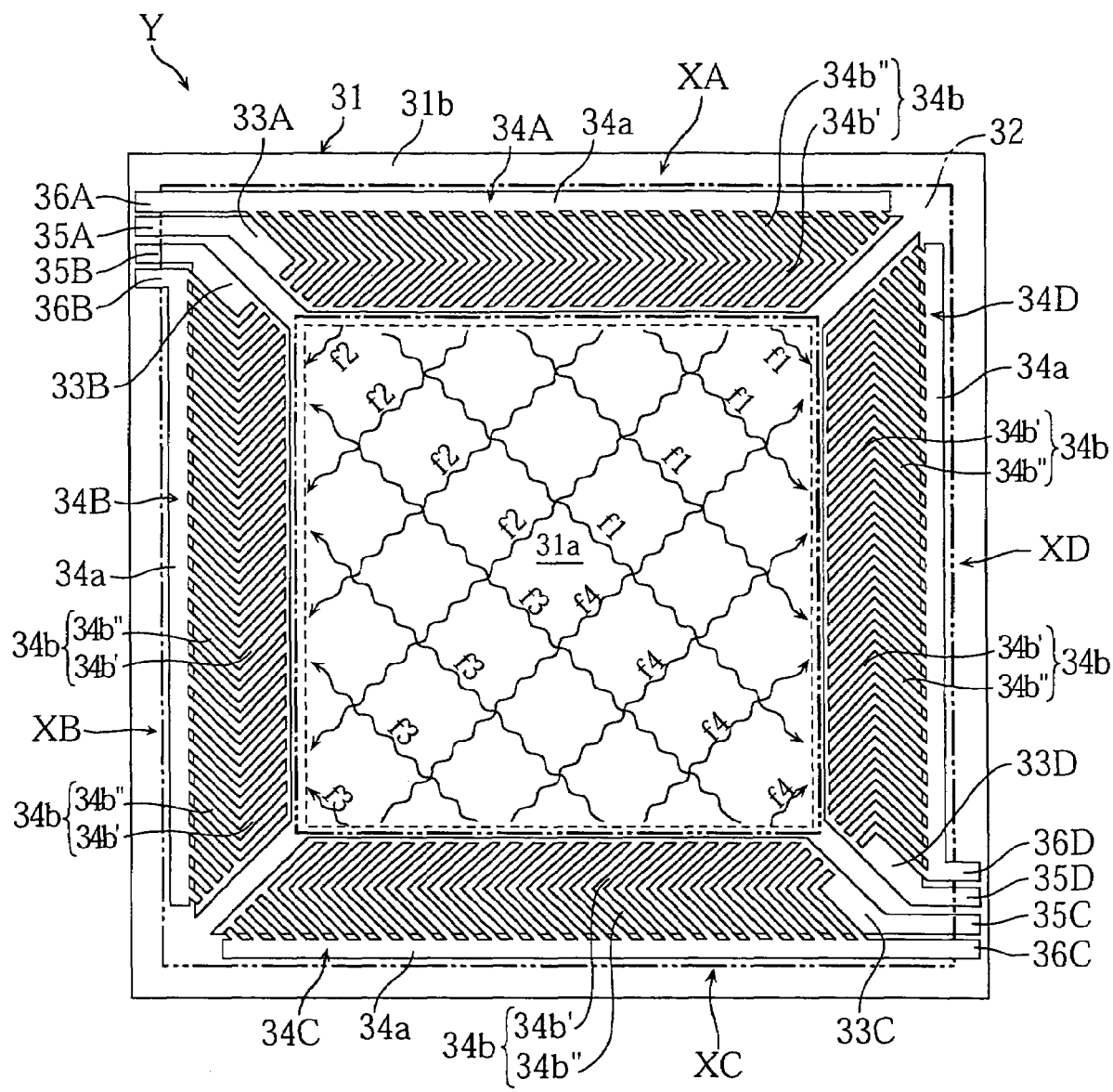
FIG. 7 shows a touch panel device according to a third embodiment of the present invention.
Figure 8:
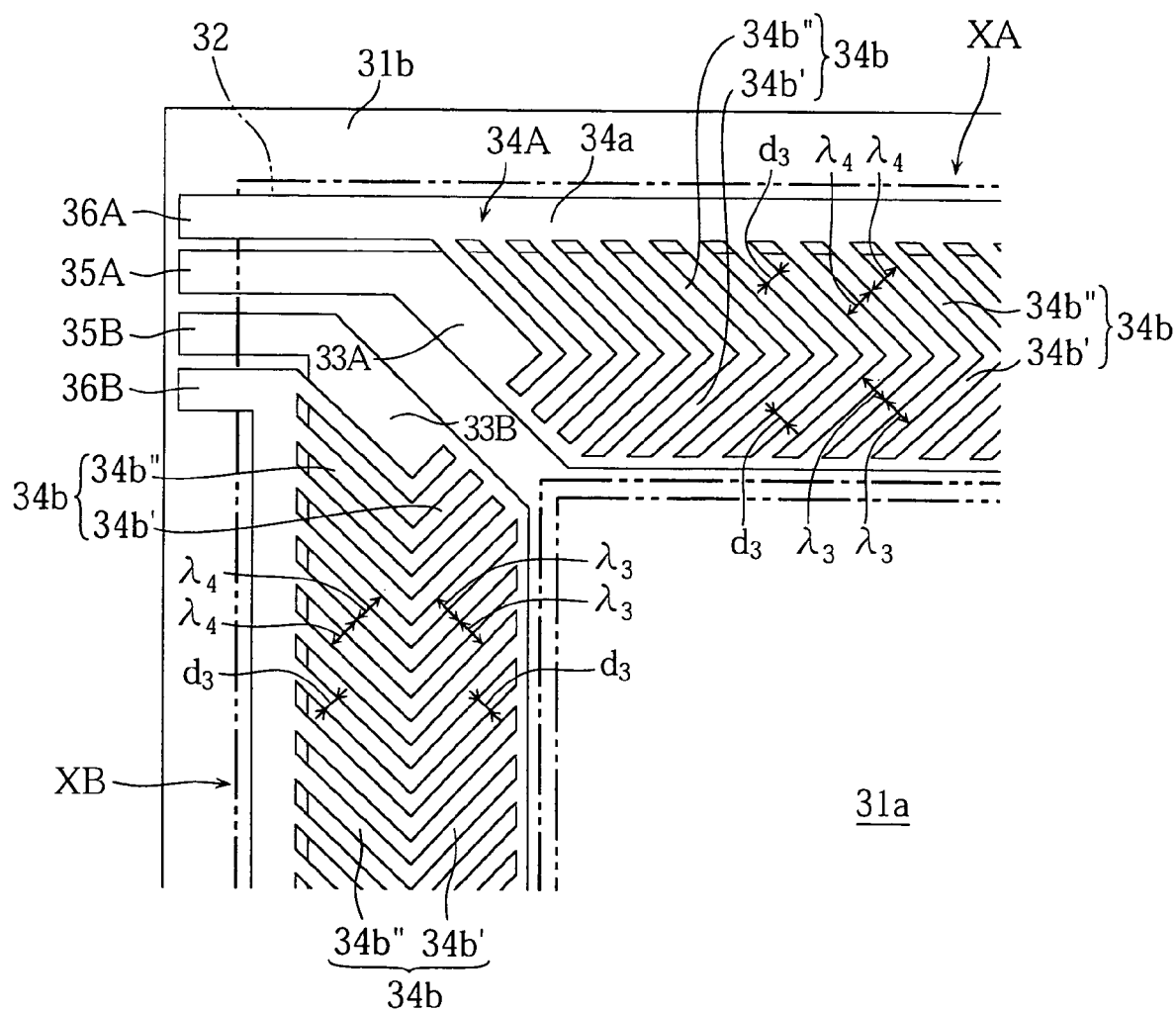
FIG. 8 is an enlarged view of part of the touch panel device shown in FIG. 7.

FIGS. 7 and 8 show a touch panel device Y according to a third embodiment of the present invention. The touch panel device Y has a substrate 31, a piezoelectric film 32, and electrodes 33A to 33D and 34A to 34D, and is constituted as a surface acoustic wave type touch panel device. The piezoelectric film 32 is shown with a virtual line to make the drawings clearer.

The substrate 31 is a medium through which surface acoustic waves will propagate, and is a transparent substrate having a detection region 31a and a peripheral region 31b. The boundary between the detection region 31a and the peripheral region 31b is shown by a dashed line. The substrate 31 is, for example, a non-piezoelectric substrate such as a transparent glass substrate, and has a thickness of, for example, 0.7 to 1.1 mm. The detection region 31a is the region in which detection is to be carried out in the touch panel device Y, and in the present embodiment is rectangular. The peripheral region 31b is a region that surrounds the detection region 31a, and has provided therein exciting means and receiving means, described below, of the touch panel device Y.

The piezoelectric film 32 is provided in the peripheral region 31b of the substrate 31, and as with the piezoelectric film 12 in the first embodiment, is made of a piezoelectric material that exhibits a piezoelectric effect and an inverse piezoelectric effect. The thickness h of the piezoelectric film 32 is, for example, 1.0 to 3.0 μm.

The electrodes 33A to 33D are interposed between the substrate 31 and the piezoelectric film 32, and each is made of an Al alloy containing 0.1 to 3 wt % of at least one metal selected from the group consisting of Ti, Cr, Ni, Cu, Zn, Pd, Ag, Hf, W, Pt and Au. The thickness of the electrodes 33A to 33D is, for example, 300 to 600 nm. Continuing on from the electrodes 33A to 33D are respectively corresponding terminals 35A to 35D. Each of the terminals 35A to 35D has a part that is exposed to the outside.

The electrodes 34A to 34D are provided on the piezoelectric film 32, and each has a comb tooth structure comprising a base portion 34a and a plurality of branch electrodes 34b. The branch electrodes 34b belonging to a particular electrode all extend out from the same base portion 34a, and are parallel to one another.

In the present embodiment, each of the mutually parallel branch electrodes 34b has an inside portion 34b' that is relatively close to the detection region 31a and an outside portion 34b" that is relatively far from the detection region 31a; the inside portion 34b' and the outside portion 34b" extend in different prescribed directions. That is, each of the branch electrodes 34b is bent through a prescribed angle. The bending angle is set in accordance with the ratio of adjacent sides defining the rectangular detection region 31a. For example, in the case that the detection region 31a is square, i.e. the case that the ratio of adjacent sides is 1:1, the bending angle is 45°. Moreover, the branch electrodes 34b face the electrodes 33A to 33D with the piezoelectric film 32 therebetween.

The thickness of each of the electrodes 34 is, for example, 300 to 600 nm, and the width $d_3$ (shown in FIG. 8) of each of the branch electrodes 34b is, for example, 40 to 60 μm. Moreover, as with the electrode period $\lambda_1$ described earlier, the electrode period $\lambda_3$ (shown in FIG. 8) of the inside portions 34b' of the branch electrodes 34b and the electrode period $\lambda_4$ (shown in FIG. 8) of the outside portions 34b" are each, for example, 100 to 150 μm. Within a single electrode, the electrode period $\lambda_3$ and the electrode period $\lambda_4$ are set to be the same as or different to one another in accordance with the driving method of the touch panel device Y. Moreover, each of the electrode period $\lambda_3$ and the electrode period $\lambda_4$ is set to be the same or different between the electrodes 34A to 34D in accordance with the driving method of the touch panel device Y. The thickness h of the piezoelectric film 32 and the electrode period $\lambda_3$ preferably satisfy the relationship $0.005 \leq h/\lambda_3 \leq 0.1$. Similarly, the thickness h of the piezoelectric film 32 and the electrode period $\lambda_4$ preferably satisfy the relationship $0.005 \leq h/\lambda_4 \leq 0.1$.

The electrodes 34A to 34D each comprise a prescribed electrically conductive material. As the constituent material of the electrodes 34A to 34D, the same as for the electrodes 33A to 33D may be used. Moreover, continuing on from the electrodes 34A to 34D are respectively corresponding terminals 36A to 36D.

The touch panel device Y has four piezoelectric devices X (piezoelectric devices XA to XD) according to the first embodiment in the peripheral region 31b of the substrate 31. Specifically, each of the pair of electrodes 33A and 34A, the pair of electrodes 33B and 34B, the pair of electrodes 33C and 34C, and the pair of electrodes 33D and 34D corresponds to the pair of electrodes 13 and 14 of a piezoelectric device X, the piezoelectric film 32 sandwiched between each pair of electrodes includes the four piezoelectric films 12 of the four piezoelectric devices X, and the substrate 31 supporting the above includes the four substrates 11 of the four piezoelectric devices X. Moreover, each of the terminals 35A to 35D and the terminals 36A to 36D corresponds to the terminal 15 or terminal 16 of a piezoelectric device X. This touch panel device Y containing four piezoelectric devices X can be manufactured using the method of manufacturing the piezoelectric device X described earlier with reference to FIGS. 3A to 3C.

During operation of the touch panel device Y, for example, the mutually facing two piezoelectric devices XA and XC are driven intermittently with different timings to one other.

The piezoelectric device XA is driven by applying an AC voltage between the electrodes 33A and 34A via the terminals 35A and 36A. During the driving, surface acoustic waves (SAWs) f1 and f2 of two prescribed frequencies are excited in the piezoelectric device XA. The SAWs f1 are excited so as to propagate in a direction orthogonal to the inside portions 34b' of the branch electrodes 34b in the piezoelectric device XA. The SAWs f2 are excited so as to propagate in a direction orthogonal to the outside portions 34b" of the branch electrodes 34b.

The SAWs f1 propagate through the detection region 31a of the substrate 31, and are then received by the inside portions 34b' in the piezoelectric device XD. As a result, a reception signal is outputted from the piezoelectric device XD via the terminals 35D and 36D thereof. This reception signal is substantially outputted from the time that a SAW f1 is received by the inside portion 34b' in the piezoelectric device XD at the upper end in FIG. 7 until a SAW f1 is received by the inside portion 34b' at the lower end in FIG. 7.

The SAWs f2 propagate through the detection region 31a of the substrate 31, and are then received by the outside portions 34b" in the piezoelectric device XB. As a result, a reception signal is outputted from the piezoelectric device XB via the terminals 35B and 36B thereof. This reception signal is substantially outputted from the time that a SAW f2 is received by the outside portion 34b" in the piezoelectric device XB at the upper end in FIG. 7 until a SAW f2 is received by the outside portion 34b" at the lower end in FIG. 7.

On the other hand, the piezoelectric device XC is driven by applying an AC voltage between the electrodes 33C and 34C via the terminals 35C and 36C. During the driving, SAWs f3 and f4 of two prescribed frequencies are excited in the piezoelectric device XC. The SAWs f3 are excited so as to propagate in a direction orthogonal to the inside portions 34b' of the branch electrodes 34b in the piezoelectric device XC. The SAWs f4 are excited so as to propagate in a direction orthogonal to the outside portions 34b" of the branch electrodes 34b. This driving of the piezoelectric device XC is carried out, for example, immediately after the output of the reception signals from the piezoelectric devices XB and XD has come to an end.

The SAWs f3 propagate through the detection region 31a of the substrate 31, and are then received by the inside portions 34b' in the piezoelectric device XB. As a result, a reception signal is outputted from the piezoelectric device XB via the terminals 35B and 36B thereof. This reception signal is substantially outputted from the time that a SAW f3 is received by the inside portion 34b' in the piezoelectric device XB at the lower end in FIG. 7 until a SAW f3 is received by the inside portion 34b' at the upper end in FIG. 7.

The SAWs f4 propagate through the detection region 31a of the substrate 31, and are then received by the outside portions 34b" in the piezoelectric device XD. As a result, a reception signal is outputted from the piezoelectric device XD via the terminals 35D and 36D thereof. This reception signal is substantially outputted from the time that a SAW f4 is received by the outside portion 34b" in the piezoelectric device XD at the lower end in FIG. 7 until a SAW f4 is received by the outside portion 34b" at the upper end in FIG. 7.

During the operation of the touch panel device Y, the sequence of operations described above from the excitation of the SAWs f1 and f2 by the piezoelectric device XA to the output of the reception signals from the piezoelectric devices XB and XD due to the reception of the SAWs f3 and f4 is carried out repeatedly.

During the operation of the touch panel device Y, if a finger or the like is in contact with any position in the detection region 31a of the substrate 31, then the amplitude of each of the SAWs f1 to f4 will be attenuated at that position upon passing through that position. The output levels of the reception signals outputted from the piezoelectric devices XB and XD will drop in accordance with the amplitude-attenuated SAWs, and hence the position of contact within the detection region 31a can be identified/detected by detecting and analyzing when the output levels of the reception signals drop.

To operate the touch panel device Y, it is also possible to use the piezoelectric devices XB and XD instead of the piezoelectric devices XA and XC as the exciting means, and use the piezoelectric devices XA and XC instead of the piezoelectric devices XB and XD as the receiving means.

The touch panel device Y has piezoelectric devices X (piezoelectric devices XA to XD) of the first embodiment having a high electromechanical conversion efficiency as the exciting means and receiving means. Such a touch panel device Y is thus suitable in terms of reducing the driving voltage or improving the detection precision.

Figure 9:
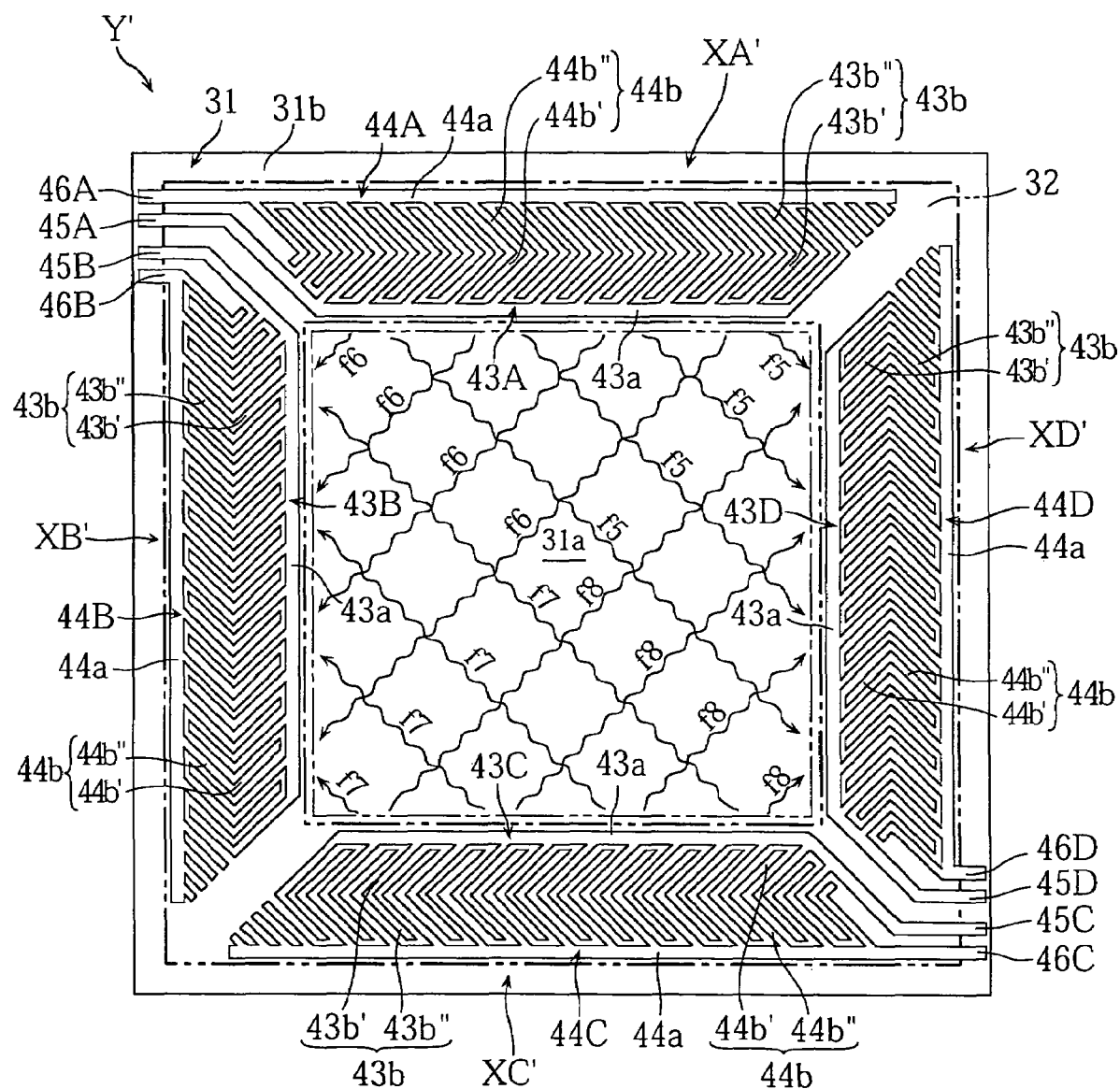
FIG. 9 shows a touch panel device according to a fourth embodiment of the present invention.
Figure 10:
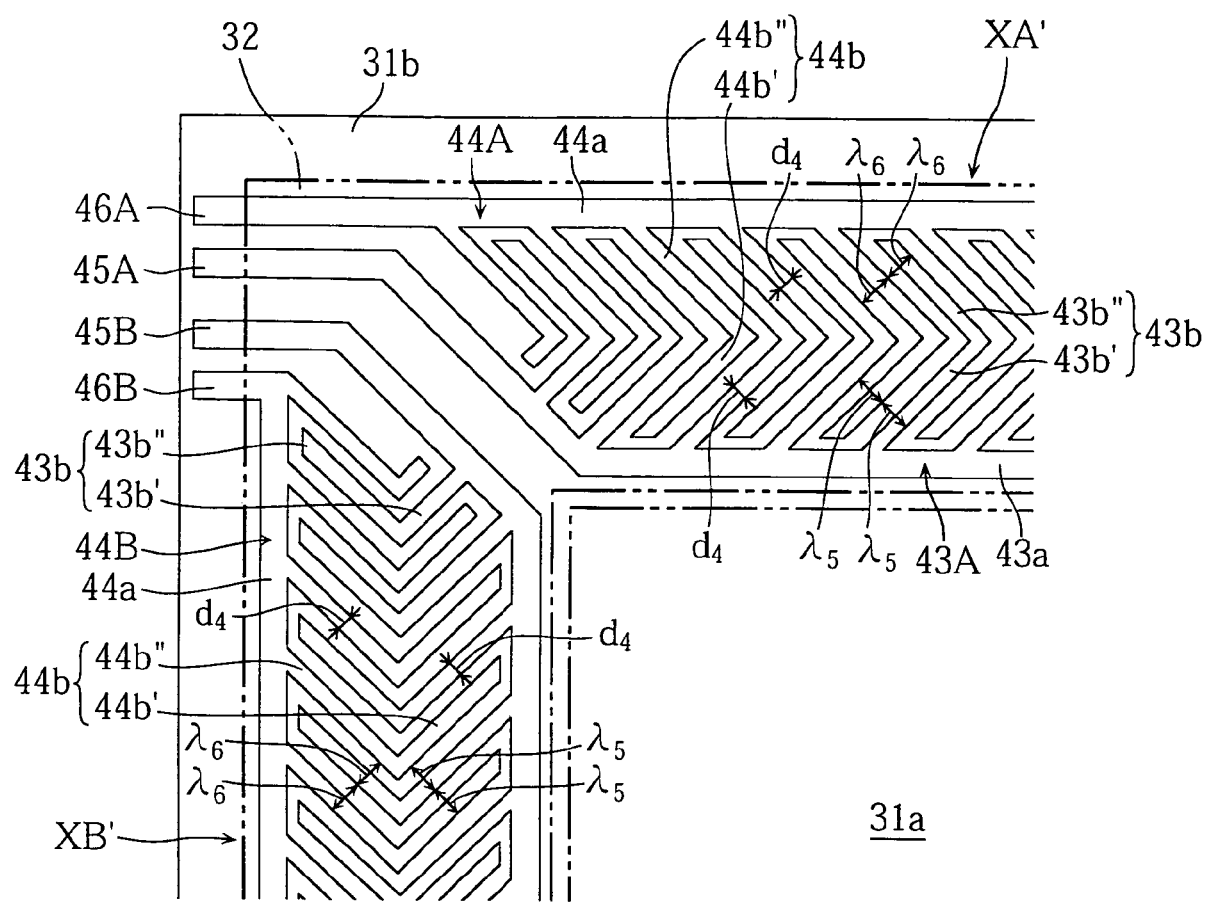
FIG. 10 is an enlarged view of part of the touch panel device shown in FIG. 9.

FIGS. 9 and 10 show a touch panel device Y' according to a fourth embodiment of the present invention. The touch panel device Y' has a substrate 31, a piezoelectric film 32, and electrodes 43A to 43D and 44A to 44D, and is constituted as a surface acoustic wave type touch panel device. The touch panel device Y' differs to the touch panel device Y in having the electrodes 43A to 43D and 44A to 44D instead of the electrodes 33A to 33D and 34A to 34D. The substrate 31 and the piezoelectric film 32 are as described above with regard to the third embodiment.

Each of the pair of electrodes 43A and 44A, the pair of electrodes 43B and 44B, the pair of electrodes 43C and 44C, and the pair of electrodes 43D and 44D forms an interdigital transducer interposed between the substrate 31 and the piezoelectric film 32, and each electrode is made of an Al alloy containing 0.1 to 3 wt % of at least one metal selected from the group consisting of Ti, Cr, Ni, Cu, Zn, Pd, Ag, Hf, W, Pt and Au.

Each of the electrodes 43A to 43D has a comb tooth structure comprising a base portion 43a and a plurality of branch electrodes 43b. The branch electrodes 43b belonging to a particular electrode all extend out from the same base portion 43a, and are parallel to one another. In the present embodiment, each of the mutually parallel branch electrodes 43b has an inside portion 43b' that is relatively close to the detection region 31a and an outside portion 43b" that is relatively far from the detection region 31a; the inside portion 43b' and the outside portion 43b" extend in different prescribed directions. That is, each of the branch electrodes 43b is bent through a prescribed angle. Moreover, continuing on from the electrodes 43A to 43D are respectively corresponding terminals 45A to 45D. Each of the terminals 45A to 45D has a part that is exposed to the outside.

Each of the electrodes 44A to 44D has a comb tooth structure comprising a base portion 44a and a plurality of branch electrodes 44b. The branch electrodes 44b belonging to a particular electrode all extend out from the same base portion 44a, and are parallel to one another. Moreover, the branch electrodes 44b are also parallel to the branch electrodes 43b. In the present embodiment, each of the mutually parallel branch electrodes 44b has an inside portion 44b' and an outside portion 44b"; the inside portion 44b' and the outside portion 44b" extend in different prescribed directions. That is, each of the branch electrodes 44b is bent through a prescribed angle. The bending angles of the branch electrodes 43b and 44b are set in accordance with the ratio of adjacent sides defining the rectangular detection region 31a. Moreover, continuing on from the electrodes 44A to 44D are respectively corresponding terminals 46A to 46D. Each of the terminals 46A to 46D has a part that is exposed to the outside.

The thickness of each of the electrodes 43 and 44 is, for example, 300 to 600 nm, and the width $d_4$ of each of the branch electrodes 43b and 44b is, for example, 20 to 30 μm. As with the electrode period $\lambda_2$ described earlier, the electrode period $\lambda_5$ of the inside portions 43b' and 44b' and the electrode period $\lambda_6$ of the outside portions 43b" and 44b" are each, for example, 100 to 150 μm.

The touch panel device Y' has four piezoelectric devices X' (piezoelectric devices XA' to XD') according to the second embodiment in the peripheral region 31b of the substrate 31. Specifically, each of the pair of electrodes 43A and 44A, the pair of electrodes 43B and 44B, the pair of electrodes 43C and 44C, and the pair of electrodes 43D and 44D corresponds to the pair of electrodes 23 and 24 of a piezoelectric device X', the piezoelectric film 32 sandwiched between each pair of electrodes includes the four piezoelectric films 12 of the four piezoelectric devices X', and the substrate 31 supporting the above includes the four substrates 11 of the four piezoelectric devices X'. Moreover, each of the terminals 45A to 45D and the terminals 46A to 46D corresponds to the terminal 25 or terminal 26 of a piezoelectric device X'. This touch panel device Y' containing four piezoelectric devices X' can be manufactured using the method of manufacturing the piezoelectric device X' described earlier with reference to FIGS. 6A to 6C.

During operation of the touch panel device Y', for example, the mutually facing two piezoelectric devices XA' and XC' are driven intermittently with different timings to one other.

The piezoelectric device XA' is driven by applying an AC voltage between the electrodes 43A and 44A via the terminals 45A and 46A. During the driving, surface acoustic waves (SAWs) f5 and f6 of two prescribed frequencies are excited in the piezoelectric device XA'. The SAWs f5 are excited so as to propagate in a direction orthogonal to the inside portions 43b' and 44b' in the piezoelectric device XA'. The SAWs f6 are excited so as to propagate in a direction orthogonal to the outside portions 43b" and 44b" in the piezoelectric device XA'.

The SAWs f5 propagate through the detection region 31a of the substrate 31, and are then received by the inside portions 43b' and 44b' in the piezoelectric device XD'. As a result, a reception signal is outputted from the piezoelectric device XD' via the terminals 45D and 46D thereof. This reception signal is substantially outputted from the time that a SAW f5 is received by the inside portion 43b' (44b') in the piezoelectric device XD' at the upper end in FIG. 9 until a SAW f5 is received by the inside portion 43b' (44b') at the lower end in FIG. 9.

The SAWs f6 propagate through the detection region 31a of the substrate 31, and are then received by the outside portions 43b" and 44b" in the piezoelectric device XB'. As a result, a reception signal is outputted from the piezoelectric device XB' via the terminals 45B and 46B thereof. This reception signal is substantially outputted from the time that a SAW f6 is received by the outside portion 43b" (44b") in the piezoelectric device XB' at the upper end in FIG. 9 until a SAW f6 is received by the outside portion 43b" (44b") at the lower end in FIG. 9.

On the other hand, the piezoelectric device XC' is driven by applying an AC voltage between the electrodes 43C and 44C via the terminals 45C and 46C. During the driving, surface acoustic waves (SAWs) f7 and f8 of two prescribed frequencies are excited in the piezoelectric device XC'. The SAWs f7 are excited so as to propagate in a direction orthogonal to the inside portions 43b' and 44b' in the piezoelectric device XC'. The SAWs f8 are excited so as to propagate in a direction orthogonal to the outside portions 43b" and 44b" in the piezoelectric device XC'. This driving of the piezoelectric device XC' is carried out, for example, immediately after the output of the reception signals from the piezoelectric devices XB' and XD' has come to an end.

The SAWs f7 propagate through the detection region 31a of the substrate 31, and are then received by the inside portions 43b' and 44b' in the piezoelectric device XB'. As a result, a reception signal is outputted from the piezoelectric device XB' via the terminals 45B and 46B thereof. This reception signal is substantially outputted from the time that a SAW f7 is received by the inside portion 43b' (44b') in the piezoelectric device XB' at the lower end in FIG. 9 until a SAW f7 is received by the inside portion 43b' (44b') at the upper end in FIG. 9.

The SAWs f8 propagate through the detection region 31a of the substrate 31, and are then received by the outside portions 43b" and 44b" in the piezoelectric device XD'. As a result, a reception signal is outputted from the piezoelectric device XD' via the terminals 45D and 46D thereof. This reception signal is substantially outputted from the time that a SAW f8 is received by the outside portion 43b" (44b") in the piezoelectric device XD' at the lower end in FIG. 9 until a SAW f8 is received by the outside portion 43b" (44b") at the upper end in FIG. 9.

During the operation of the touch panel device Y', the sequence of operations described above from the excitation of the SAWs f5 and f6 by the piezoelectric device XA' to the output of the reception signals from the piezoelectric devices XB' and XD' due to the reception of the SAWs f7 and f8 is carried out repeatedly.

During the operation of the touch panel device Y', if a finger or the like is in contact with any position in the detection region 31a of the substrate 31, then the amplitude of each of the SAWs f5 to f8 will be attenuated at that position upon passing through that position. The output levels of the reception signals outputted from the piezoelectric devices XB' and XD' will drop in accordance with the amplitude-attenuated SAWs, and hence the position of contact within the detection region 31a can be identified/detected by detecting and analyzing when the output levels of the reception signals outputted from the piezoelectric devices XB' and XD' drop.

To operate the touch panel device Y', it is also possible to use the piezoelectric devices XB' and XD' instead of the piezoelectric devices XA' and XC' as the exciting means, and use the piezoelectric devices XA' and XC' instead of the piezoelectric devices XB' and XD' as the receiving means.

The touch panel device Y' has piezoelectric devices X' (piezoelectric devices XA' to XD') of the second embodiment having a high electromechanical conversion efficiency as the exciting means and receiving means. Such a touch panel device Y' is thus suitable in terms of reducing the driving voltage or improving the detection precision.

Other forms can be used for the method of operating the touch panel device Y or Y'. For example, the methods described in Japanese Patent Application Laid-open No. 2002-222041 can be used for operating the touch panel devices according to the first to third embodiments described in Japanese Patent Application Laid-open No. 2002-222041.

EXAMPLE 1

Figure 11:
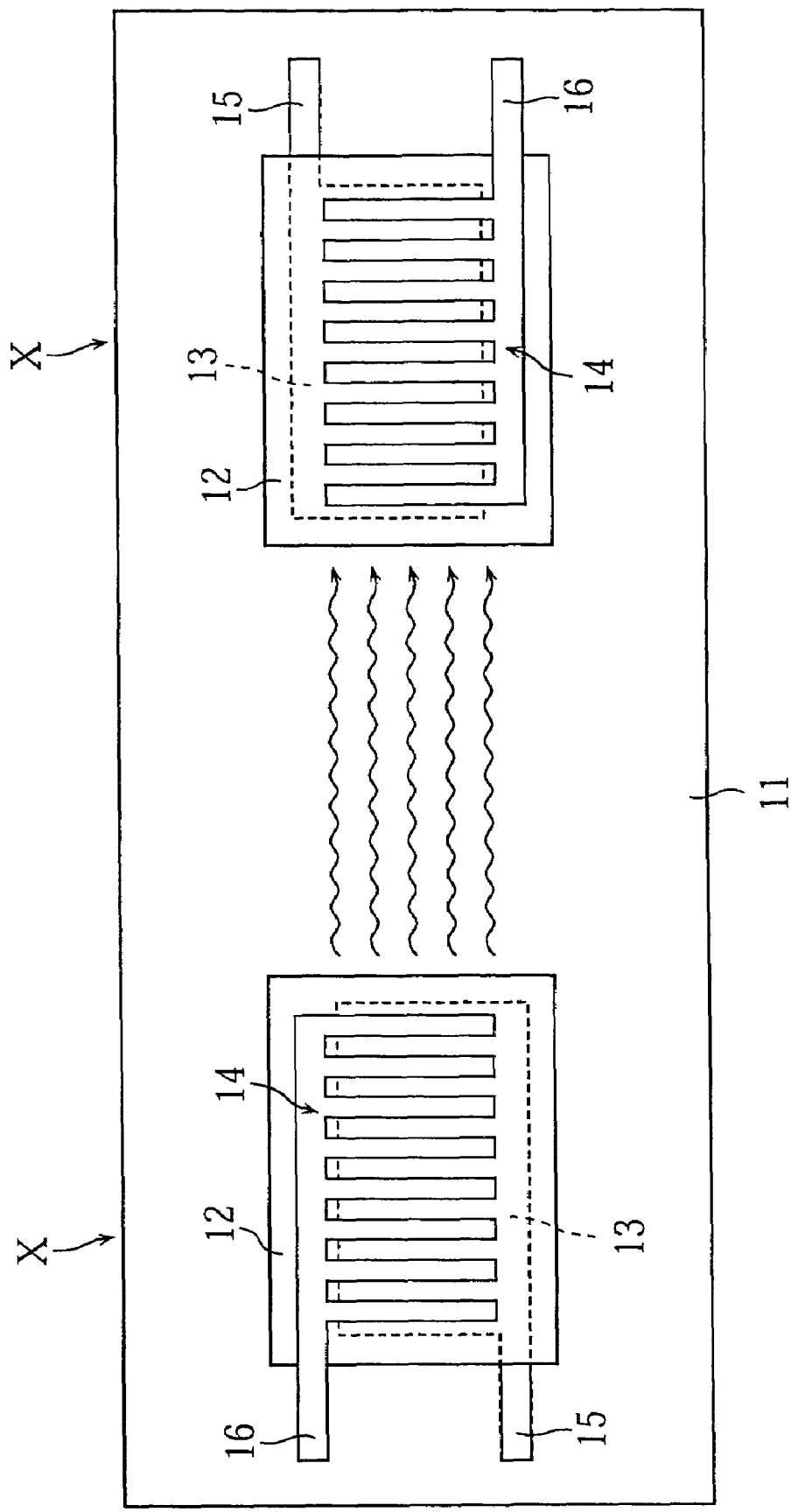
FIG. 11 shows a filter having therein the piezoelectric device shown in FIG. 1.

A normal facing type filter comprising two piezoelectric devices X as shown in FIG. 11 was manufactured. Each of the piezoelectric devices X constituting the filter of the present example was a piezoelectric device X according to the first embodiment. In the manufacture of the filter, first, in a first film formation step, an Al alloy containing 1.0 wt % of Cu was deposited on a glass substrate 11 by sputtering, thus forming a 300 nm-thick Al alloy film. In the sputtering, a target of an Al alloy containing 1.0 wt % of Cu was used.

Next, the Al alloy film was etched with a prescribed resist pattern as a mask, thus patterning the Al alloy film. In this way, electrodes 13 and terminals 15 were formed on the substrate 11. After that, the surface of each of the electrodes 13 was subjected to etching treatment by reverse sputtering using an Ar plasma.

Next, in a second film formation step, ZnO was deposited on the substrate 11 by sputtering, thus forming a 2 μm-thick piezoelectric material film. Specifically, the ZnO was deposited on the substrate by reactive sputtering carried out using a ZnO sintered body target, and using Ar gas and $O_2$ gas as sputtering gases. In the sputtering, the flow rate ratio between the Ar gas and the $O_2$ gas was made to be 4:1. After that, the piezoelectric material film was etched with a prescribed resist pattern as a mask, thus patterning the piezoelectric material film. In this way, piezoelectric films 12 were formed.

Next, in a third film formation step, an Al alloy was deposited over the surface of the substrate 11 and the surface of each of the piezoelectric films 12 by sputtering, thus forming a 300 nm-thick Al alloy film. In the sputtering, the same Cu-containing Al alloy target as used when forming the electrodes 13 as described above was used. Next, the Al alloy film was etched with a prescribed resist pattern as a mask, thus patterning the Al alloy film. In this way, electrodes 14 each having a base portion 14a and a plurality of parallel branch electrodes 14b, and terminals 16 were formed. For each of the electrodes 14 in the present example, the width $d_1$ of each of the branch electrodes 14b was 44 μm, and the electrode period $\lambda_1$ of the branch electrodes 14b was 110 μm.

A plurality of filters according to the present example were manufactured using the above method. For all of the filters, the thickness h of each of the piezoelectric films 12 was 2 μm, and hence this thickness h and the electrode period $\lambda_1$ of the branch electrodes 14b satisfied the condition $0.005 \leq h/\lambda_1 \leq 0.1$.

EXAMPLE 2

A plurality of filters according to the present example were manufactured using the same method as for Example 1, except that an Al alloy containing 0.5 wt % of Cu was deposited in the first film formation step instead of the Al alloy containing 1.0 wt % of Cu. For the filters of the present example, each of the electrodes 13 thus comprised an Al alloy containing 0.5 wt % of Cu. Moreover, for all of the filters of the present example, the thickness h of each of the piezoelectric films 12 was 2 μm, and hence this thickness h and the electrode period $\lambda_1$ of the branch electrodes 14b satisfied the condition $0.005 \leq h/\lambda_1 \leq 0.1$.

EXAMPLE 3

A plurality of filters according to the present example were manufactured using the same method as for Example 1, except that an Al alloy containing 2.0 wt % of Cu was deposited in the first film formation step instead of the Al alloy containing 1.0 wt % of Cu. For the filters of the present example, each of the electrodes 13 thus comprised an Al alloy containing 2.0 wt % of Cu. Moreover, for all of the filters of the present example, the thickness h of each of the piezoelectric films 12 was 2 μm, and hence this thickness h and the electrode period $\lambda_1$ of the branch electrodes 14b satisfied the condition $0.005 \leq h/\lambda_1 \leq 0.1$.

COMPARATIVE EXAMPLE

A plurality of filters according to the present comparative example were manufactured using the same method as for Example 1, except that pure Al was deposited in the first film formation step instead of the Al alloy containing 1.0 wt % of Cu. For the filters of the present comparative example, each of the electrodes interposed between the substrate and the piezoelectric film thus comprised pure Al.

EXAMPLE 4

A filter having the same constitution as in Example 1 was manufactured, except that the piezoelectric films 12 were constituted from Mn-doped ZnO instead of ZnO. In the sputtering of the second film formation step in the manufacture of the filter, a ZnO sintered body target containing a prescribed concentration of $Mn_2O_3$ was used.

[Measurement of Insertion Loss]

Figure 12:
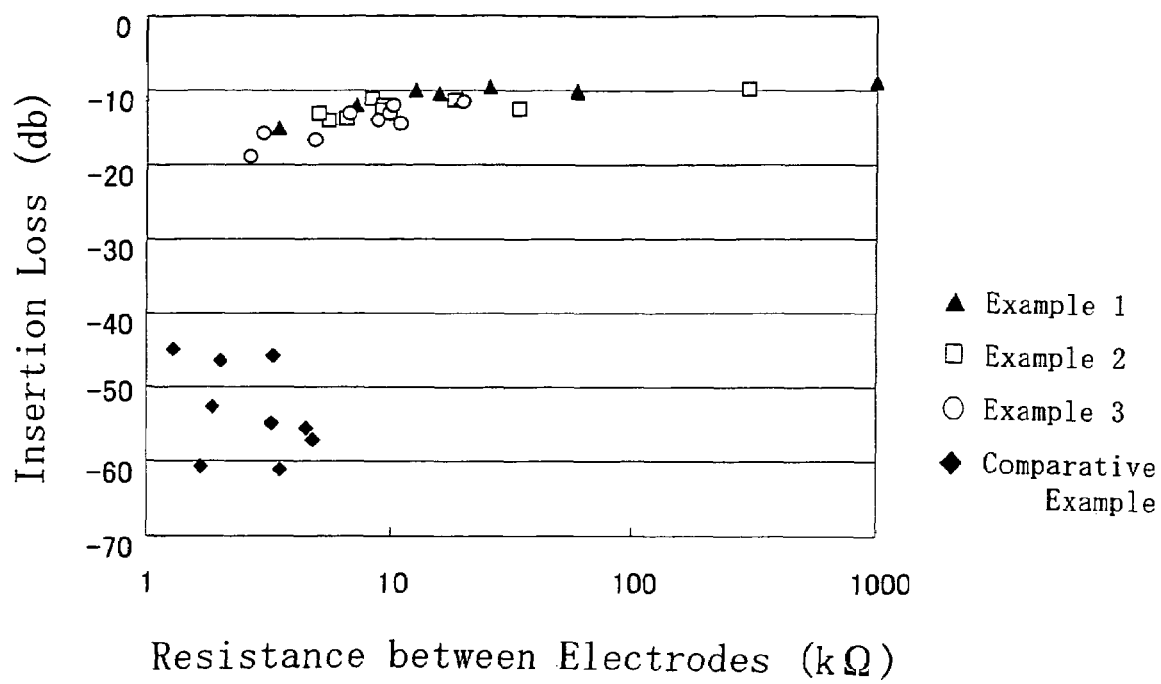
FIG. 12 shows results of insertion loss measurements for filters of Examples 1 to 3 and a Comparative Example.

For each of the filters of Examples 1 to 3 and the Comparative Example, the insertion loss between an input signal and a reception signal was measured. The results are shown in the graph of FIG. 12. In the graph of FIG. 12, the resistance (kΩ) between the pair of electrodes facing each other with the piezoelectric film therebetween is shown on the horizontal axis, and the insertion loss (dB) is shown on the vertical axis.

From the graph of FIG. 12, it can be seen that the insertion loss is smaller for the filters of Examples 1 to 3 than the filters of the Comparative Example. It is thought that this is because the electromechanical conversion efficiency in a piezoelectric device is higher in the case that the electrode interposed between the substrate and the piezoelectric film is made of an Al alloy containing a prescribed concentration of Cu than in the case that this electrode is made of pure Al. Moreover, as shown in the graph of FIG. 12, there is variation in the value of the inter-electrode resistance among the filters according to a given Example; it can be seen that among the filters according to a given Example, the greater the inter-electrode resistance, the smaller the insertion loss tends to be.

Figure 13:
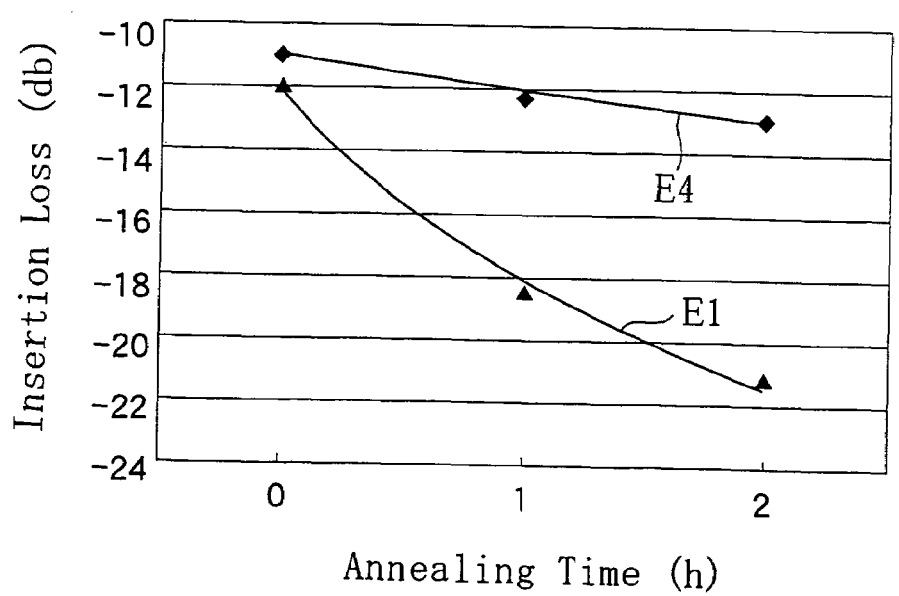
FIG. 13 shows the dependence of the insertion loss on annealing time for filters of Examples 1 and 4.

For the filters of Examples 1 and 4, the dependence of the insertion loss on the annealing time was investigated. Specifically, for the filters of Examples 1 and 4, the insertion loss was measured before annealing, after annealing for 1 hour at 250° C., and after annealing for a further 1 hour, i.e. a total of 2 hours, at 250° C. The results are shown in the graph of FIG. 13. In the graph of FIG. 13, the annealing time (hours) is shown on the horizontal axis, and the insertion loss (dB) is shown on the vertical axis. Moreover, the measurement results for the films of Example 1 are shown by line E1, and the measurement results for the films of Example 4 are shown by line E4.

From the graph of FIG. 13, it can be seen that in the case that a piezoelectric device is subjected to prescribed annealing, an Mn-doped ZnO piezoelectric film is better than an undoped ZnO piezoelectric film in terms of reducing the insertion loss. It is thought that this is because if the piezoelectric material ZnO is doped with Mn, then diffusion of the electrode-constituting material Al into the piezoelectric film is suppressed. In the case that an electrode is formed on the piezoelectric film by printing, an electrically conductive paste is printed in a prescribed pattern shape and then annealing is carried out to sinter the paste. The constitution in which the piezoelectric film is formed from Mn-doped ZnO is thus particularly beneficial in the case that an electrode is formed on the piezoelectric film by printing.

The invention claimed is:

1. A piezoelectric device comprising a non-piezoelectric substrate, a piezoelectric film formed on the substrate, a first electrode, and a second electrode;

wherein at least one of the first electrode and the second electrode is interposed between the substrate and the piezoelectric film, and made of an Al alloy containing approximately 0.1 to 3 wt % of at least one metal selected from the group consisting of Ti, Cr, Ni, Cu, Zn, Pd, Ag, Hf, W, Pt and Au;

at least one of the first electrode and the second electrode includes a base portion, and a plurality of branch electrodes that extend out from the base portion and are parallel to one another; and $h/\lambda$ has a value in range of approximately 0.005 to 0.1, wherein h is a thickness of the piezoelectric film, and $\lambda$ is an electrode period of the plurality of branch electrodes, $\lambda$ having a value in range of approximately 100 to 150 μm.

2. The piezoelectric device according to claim 1, wherein the first electrode is interposed between the substrate and the piezoelectric film, and the second electrode is provided on the piezoelectric film.

3. The piezoelectric device according to claim 2, wherein the first electrode includes a part that faces the branch electrodes with the piezoelectric film there between.

4. The piezoelectric device according to claim 1, wherein the first electrode and the second electrode are interposed between the substrate and the piezoelectric film, and form an interdigital transducer.

5. The piezoelectric device according to claim 1, wherein the piezoelectric film is made of Mn-doped ZnO.

6. A touch panel device comprising:

a non-piezoelectric substrate including a detection region and a peripheral region surrounding the detection region;

exciting means provided in the peripheral region for exciting surface acoustic waves in the substrate; and receiving means provided in the peripheral region for receiving surface acoustic waves propagated through the detection region;

wherein at least one of the exciting means and the receiving means comprises a piezoelectric film formed on the substrate, a first electrode, and a second electrode, wherein at least one of the first electrode and the second electrode is interposed between the substrate and the piezoelectric film, and made of an Al alloy containing 0.1 to 3 wt % of at least one metal selected from the group consisting of Ti, Cr, Ni, Cu, Zn, Pd, Ag, Hf, W, Pt and Au;

at least one of the first electrode and the second electrode includes a base portion, and a plurality of branch electrode that extend out from the base portion and are parallel to one another; and $h/\lambda$ has a value in range of approximately 0.005 to 0.1, wherein h is a thickness of the piezoelectric film, and $\lambda$ is an electrode period of the plurality of branch electrode, $\lambda$ having a value in a range of approximately 100 to 150 μm.

7. The touch panel device according to claim 6, wherein the first electrode is interposed between the substrate and the piezoelectric film, and the second electrode is provided on the piezoelectric film.

8. The touch panel device according to claim 7, wherein the first electrode includes a part that faces the branch electrodes with the piezoelectric film there between.

9. The touch panel device according to claim 6, wherein the first electrode and the second electrode are interposed between the substrate and the piezoelectric film, and form an interdigital transducer.

10. The touch panel device according to claim 6, wherein the piezoelectric film is made of Mn-doped ZnO.

* * * * *

UNITED STATES PATENT AND TRADEMARK OFFICE
CERTIFICATE OF CORRECTION

| | |
|---|---|
| PATENT NO. | : 7,605,523 B2 |
| APPLICATION NO. | : 11/283844 |
| DATED | : October 20, 2009 |
| INVENTOR(S) | : Takashi Katsuki et al. |

It is certified that error appears in the above-identified patent and that said Letters Patent is hereby corrected as shown below:

Title Page, Item (73) Column 2 (Abstract), Line 1, after "(11)" insert --,--.

Column 18, Lines 20-21, change "electrode" to --electrodes--.

Column 18, Lines 25-26, change "electrode," to --electrodes,--.

Signed and Sealed this

Nineteenth Day of January, 2010

David J. Kappos
*Director of the United States Patent and Trademark Office*